United States Patent [19]

Pircher

[11] 4,084,903
[45] Apr. 18, 1978

[54] HIGH-PRECISION MASK PHOTOREPEATER

[75] Inventor: Georges Pircher, Paris, France

[73] Assignee: Thomson-CSF, Paris, France

[21] Appl. No.: 735,890

[22] Filed: Oct. 26, 1976

[30] Foreign Application Priority Data

Oct. 31, 1975  France .............................. 75 33464

[51] Int. Cl.² ............................................. G03B 27/42
[52] U.S. Cl. ........................................ 355/53; 355/54; 355/79
[58] Field of Search ............................. 355/53, 54, 79

[56] References Cited

U.S. PATENT DOCUMENTS

| | | | |
|---|---|---|---|
| 3,632,205 | 1/1972 | Marcy | 355/53 |
| 3,704,657 | 12/1972 | Sliwkowski et al. | 355/53 X |
| 3,704,946 | 12/1972 | Brault et al. | 355/53 X |

Primary Examiner—Richard A. Wintercorn
Attorney, Agent, or Firm—Cushman, Darby & Cushman

[57] ABSTRACT

A high-precision mask photorepeater projects the image of a mask upon a sample. The sample upon which an impression is to be made is a thin plate of semiconductor material with dimensions of the order of 10 centimeters. Each zone to be recorded is brought opposite the lens. A system of pneumatic sensors brings the center of the zone to be recorded into the correct plane and positions this zone in the focal plane of the lens.

5 Claims, 8 Drawing Figures

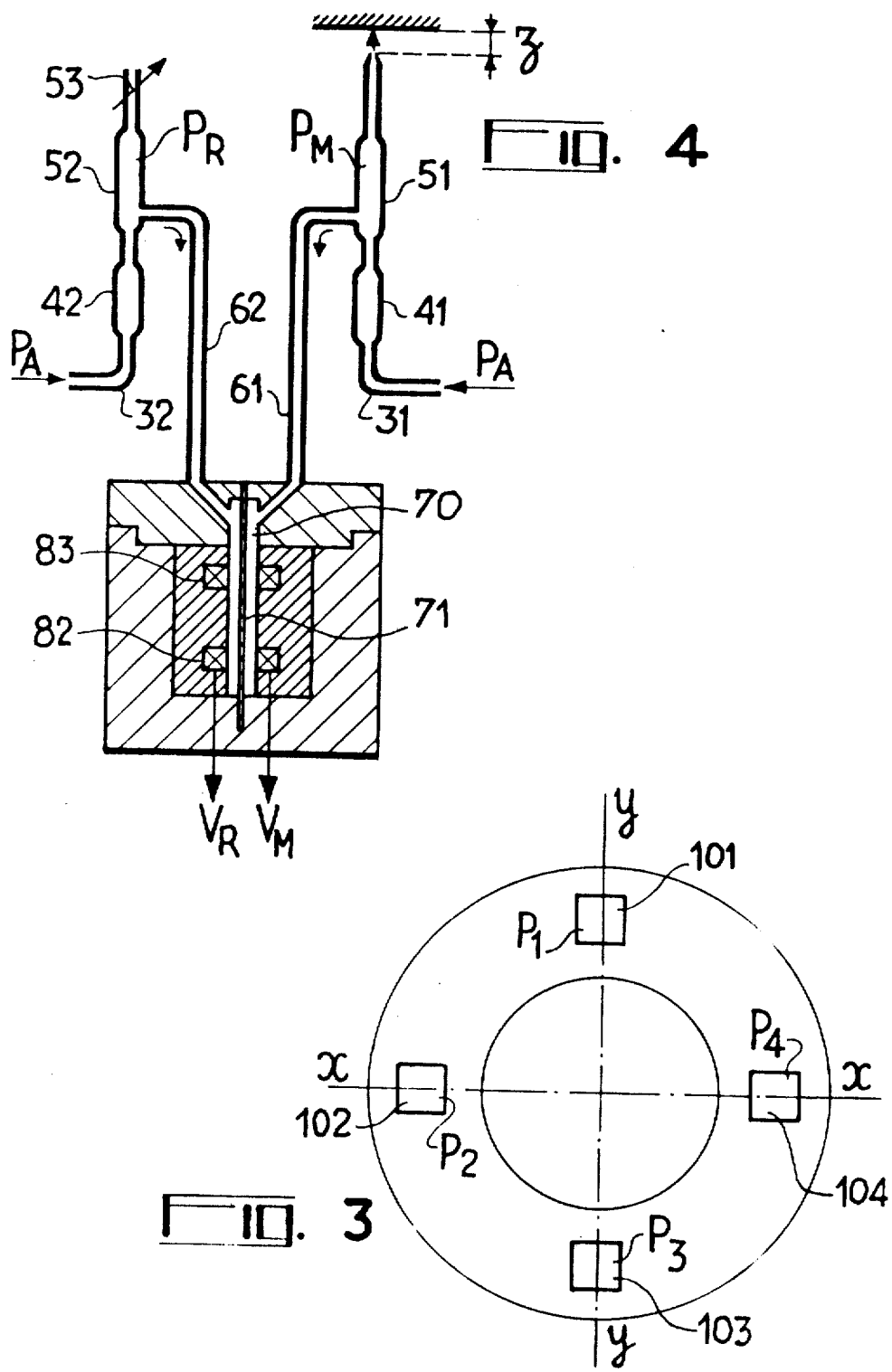

HIGH-PRECISION MASK PHOTOREPEATER

One of the problems encountered in the field of semiconductors is to deposit onto one and the same thin plate several identical high-definition images of very small dimensions. More specifically, it is necessary to deposit patterns with a resolving power of 1 micron onto one and the same thin plate of which the principal dimensions do not exceed 10 centimeters (typically 3 inches i.e. approximately 75 millimeters). This problem is difficult to solve for the following reasons:

In cases where optical device called photorepeaters are used, which is particularly the subject of the present invention, the field depth is of the order of ± 2 microns at the wavelengths used.

The slices of semiconductors and, more especially, silicon have cambers of as much as 10 microns, even assuming their neutral axis to be flat. Accordingly, it is desirable to have a sufficient space between the slice and the front of the optical assembly to avoid any risk of deterioration.

Finally, it is desirable to project lines having a 1 micron thickness.

The high-accuracy mask photorepeater according to the invention enables these problems to be solved.

The mask photorepeater according to the invention comprises a light source and a lens with a magnification of less than 1, of the order of 1/10, which projects the image of a mask onto a sample which is supported by a holder intergral with a table comprising means for bringing certain regions of the specimen opposite the lens as required.

It is essentially characterized by the fact that the lens is integral with pneumatic sensors and the holder rests on the table by way of at least three piezoelectric bars which receive voltages from said pneumatic sensors in order, with each exposure, to bring the centre of the zone to be recorded to the centre of the image provided by the lens and the plane of said zone into the plane of said image.

The invention will be better understood from the following description in conjunction with the accompanying drawings, wherein:

FIG. 3 is an end view of the exit of the optical assembly.

FIG. 4 diagrammatically illustrates a differential pneumatic sensor.

Figure 5:
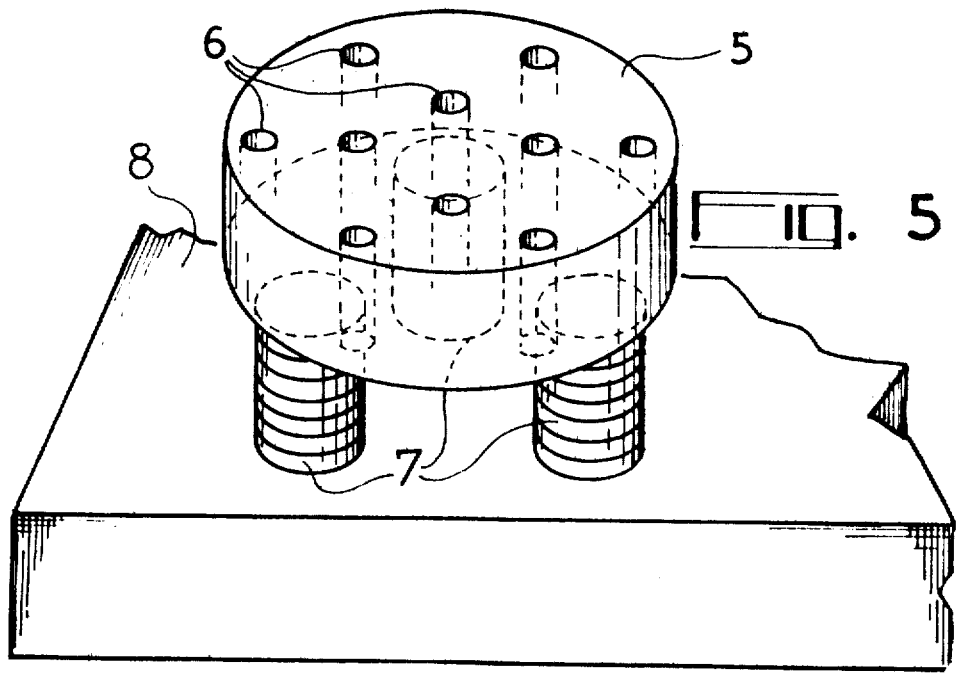

FIG. 5 is a perspective view of the specimen holder and the piezoelectric bars.

Figure 6:
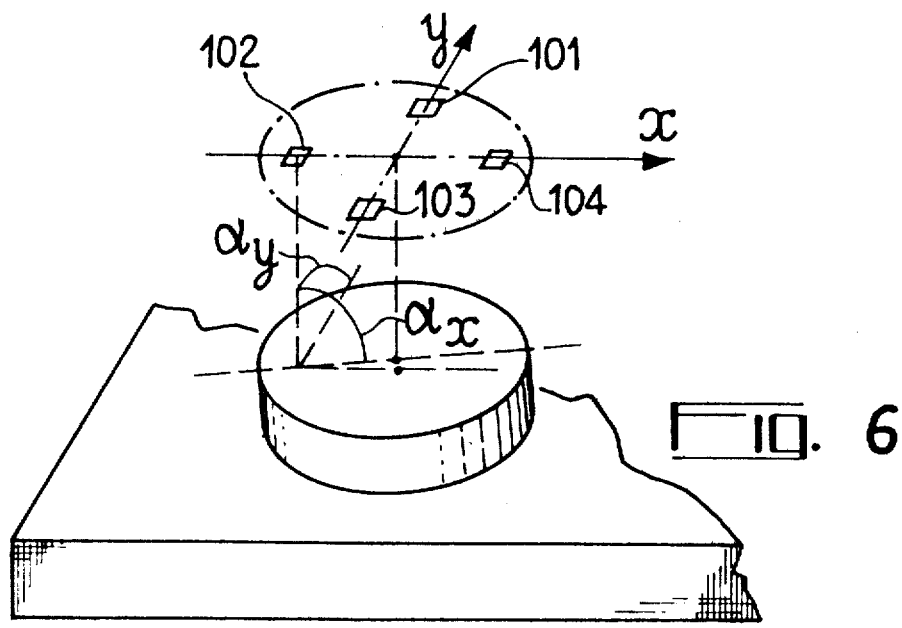

FIG. 6 is an explanatory drawing.

Figure 7:
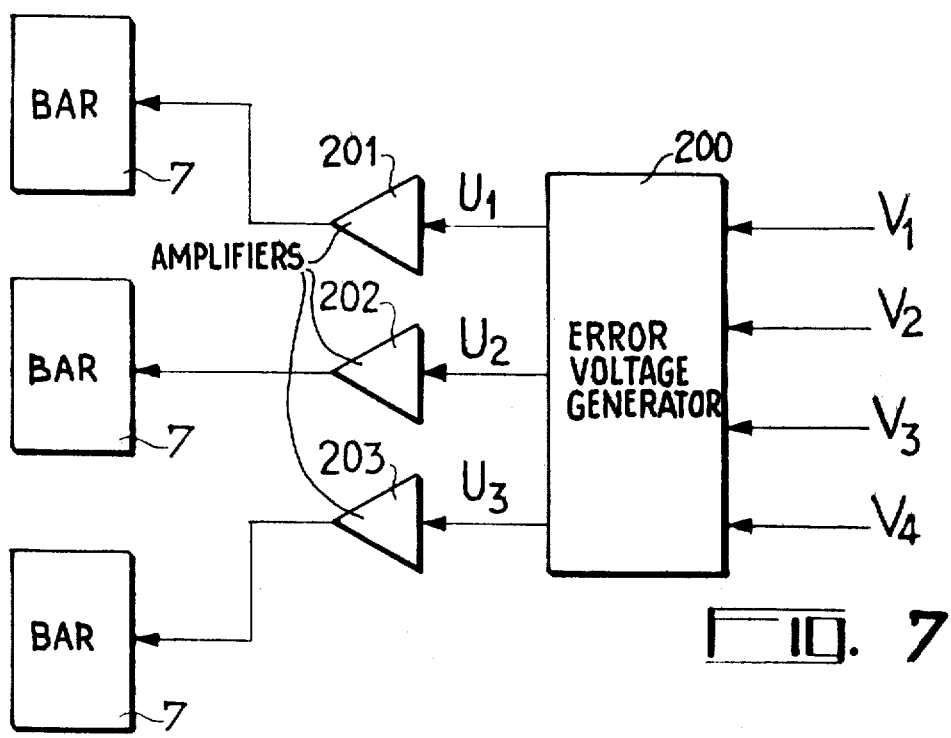

FIG. 7 is a diagram of the electrical control circuit of the bars.

Figure 8:
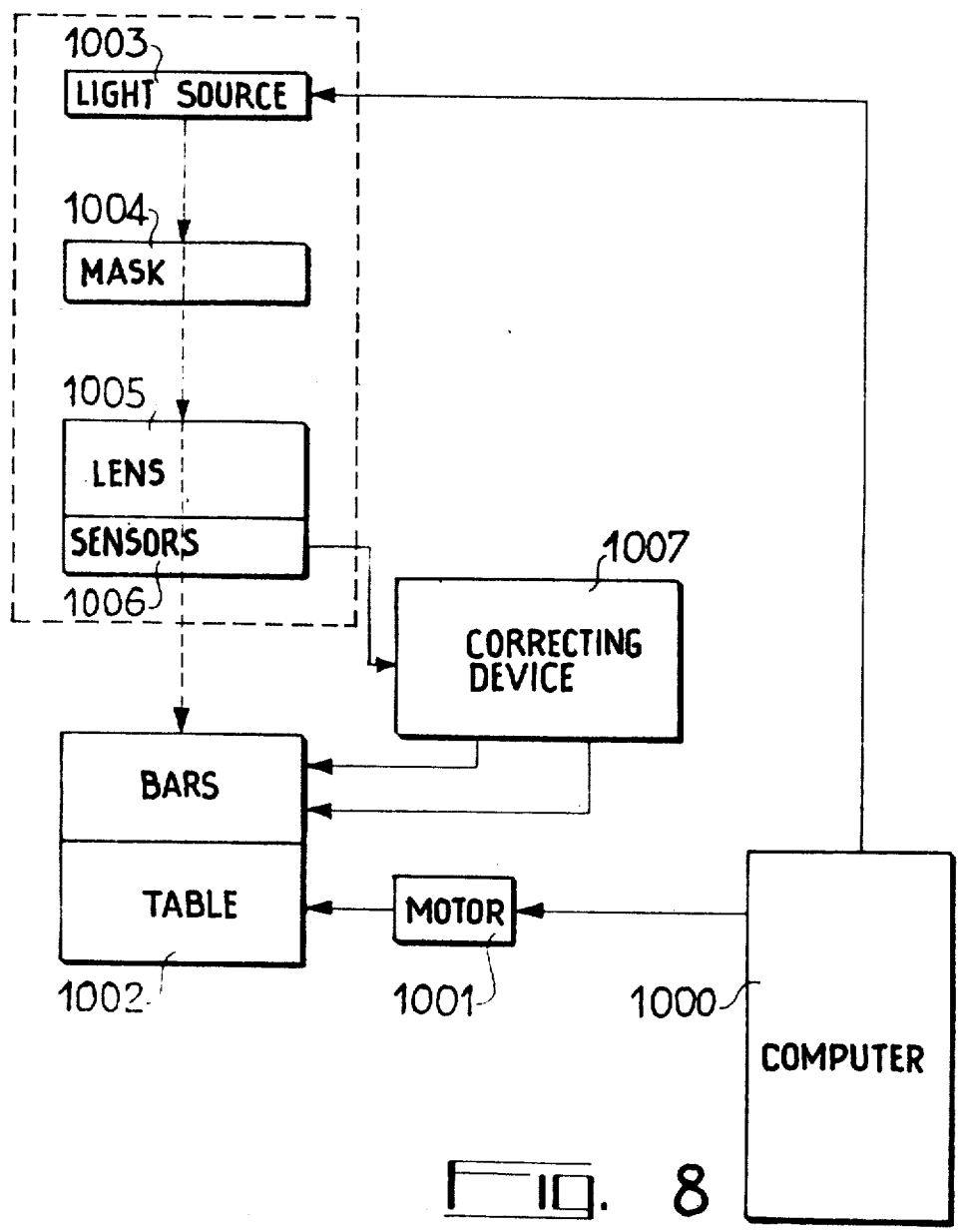

FIG. 8 is a circuit diagram showing the electronics of the apparatus as a whole.

Figure 1:
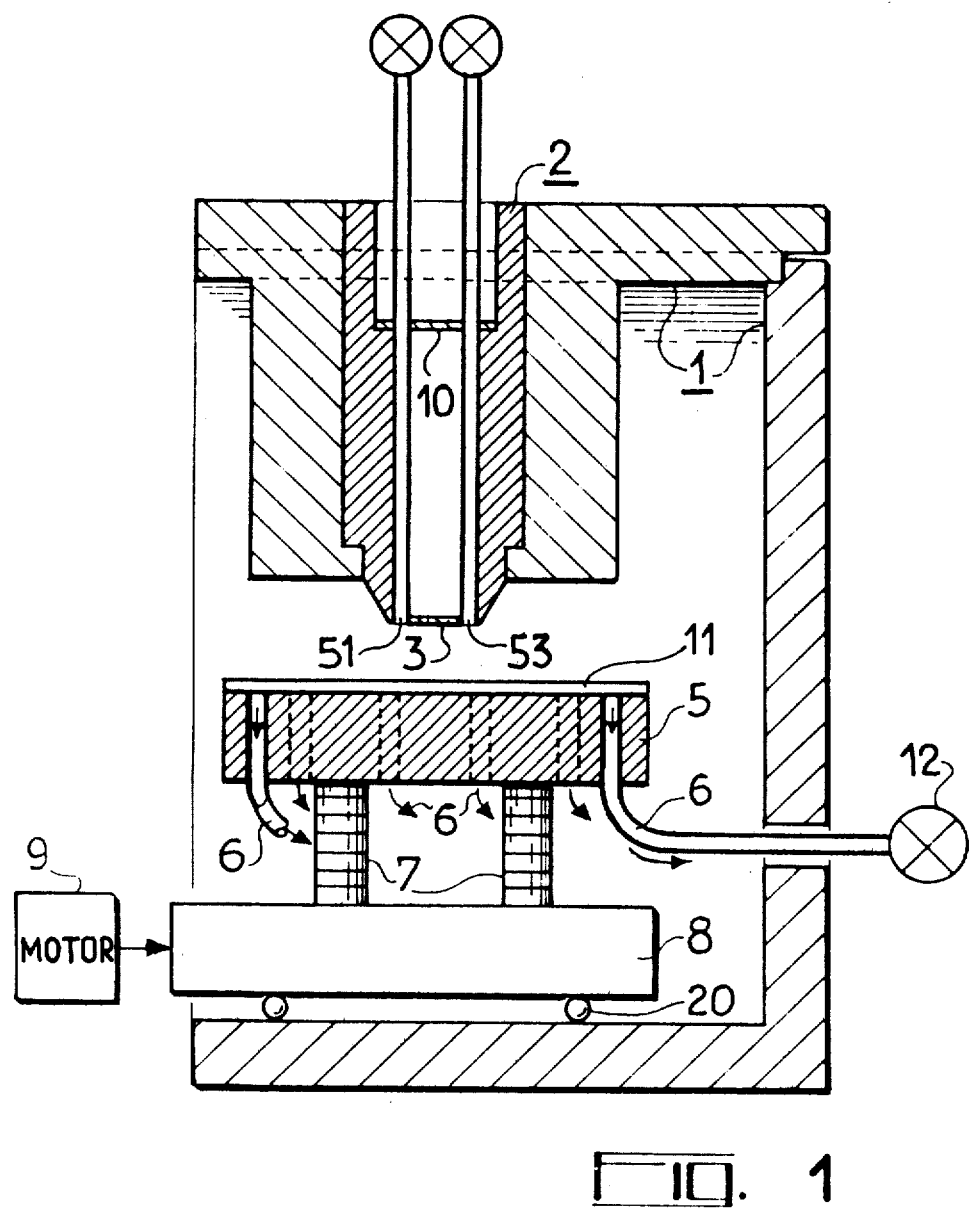
FIG. 1 is a section through one example of embodiment of the apparatus according to the invention.

FIG. 1 is a section through one example of embodiment of the apparatus according to the invention. It comprises a frame 1 which, at its upper end, supports an optical assembly 2 consisting of an eyepiece (not shown) and a lens 3. This optical assembly is itself integral with a cylindrical metal assembly 4 comprising four pipes 51 to 54, of which two 51 and 53 are shown. These pipes are intended to feed the pneumatic sensors of which the function will be described hereinafter. A sample holder 5 which itself is provided with a group of pipes 6 is supported by means of an assembly of bars 7 formed by a stack of piezoelectric ceramics on a table 8 of which the movement is controlled by a motor system 9 and which rests on the bottom of the frame 1 on rollers 20.

There are at least three of these bars although a larger number, for example four, may also be provided.

Figure 2:
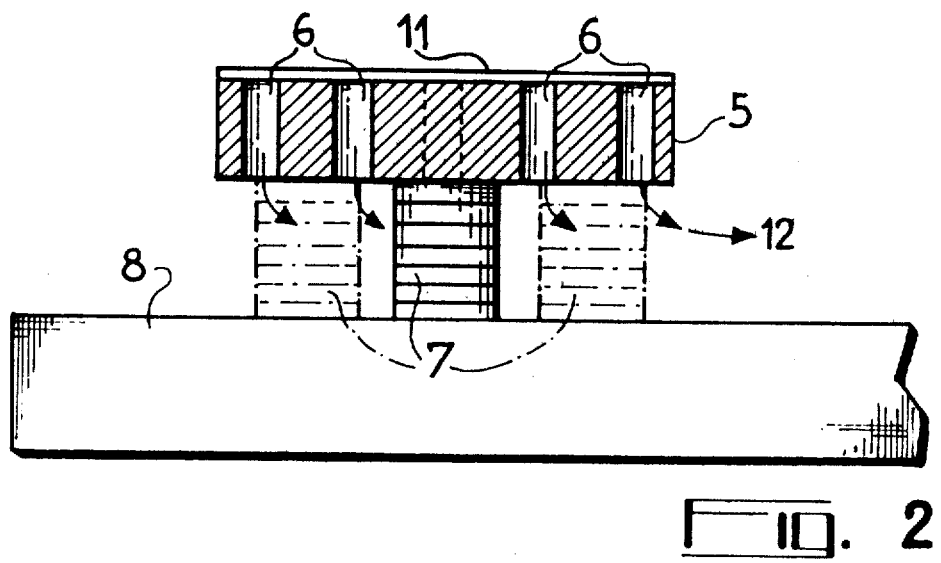
FIG. 2 is a section through the specimen/holder assembly.

The sample holder supports the specimen 11 to be recorded. The specimen has a diameter of the order of 100 mm and a thickness of about 100 microns. A pump 12 maintains a pressure difference between the lens and the bottom of the apparatus. By way of the pipes 6, the specimen is thus applied to the speciment holder which keeps its neutral axis substantially flat (FIG. 2).

The table is moved by a group of motors 9 so as to bring the various regions of the specimen opposite the lens. The lens projects onto the thin plate of silicon the image of a mask 10 formed by a line assembly which, reduced to a scale of 1/10, form lines on the specimen having each a thickness of the order of 1 micron. The image thus reproduced has transverse dimensions of the order of 1 centimeter.

FIG. 3 shows the front surface of the lens with its four holes 101 to 104 positioned at the ends of two perpendicular diameters across which flow gas streams of which the purpose will be described hereinafter.

FIG. 4 shows a pneumatic sensor of the type which may be used in the apparatus according to the invention. This sensor is of the so-called differential type. It is based on the fact that an obstacle at the outlet end of a gas pipe causes the rate of flow of the gas to vary. This variation in the rate of flow of the gas produces a variation in pressure which is greater, the closer the obstacle is to the outlet nozzle.

The sensor shown in FIG. 4 is of the differential type. Two pipes 31 and 32 receives a fluid under the same pressure. These pipes respectively feed the two identical chambers 41 and 42 and two nozzles 51 and 52.

The nozzle 52 is closed by an adjustable valve 53. This valve is the cause of the establishment of a known and measured reference pressure $P_R$ in a pipe 62 which opens into the nozzle. The nozzle 51 directs the flow of gas onto the obstacle which is the surface of the thin plate of silicon. The pressure to be measured $P_M$ is dependent upon the distance z between the outlet of the nozzle 51 and the thin plate. These two pipes 62 and 61 open into a cavity 70 in which an elastic membrane 71 is displaced under the effect of the difference $P_R - P_M$.

This deformation produces a change in the impedance of two circuits formed respectively by two windings 83 and 82 accommodated in a metallic element by which the cavity is closed. Accordingly, since these two circuits receive the same input voltage V, their respective output voltages are $V_R$ and $V_M$, and $Z = \phi (V_R - V_M)$.

The pressures used are of the order of 200 millibars. The reference pressure is adjusted in such a way as to give a zero error signal for the selected difference between the senor and the image plane, namely for example 20 to 30 microns.

By virtue of this arrangement, the influences of the feed pressure are eliminated.

The system makes it possible to obtain four voltages $V_1$, $V_2$, $V_3$, $V_4$ proportional to the four pressures values $(P_1 - P_R, P_2 - P_R, P_3 - P_R, P_4 - P_R)$.

For each printing to be made on the thin plate, the table 8 controlled by its motors brings the zone of which printing is to be made (FIG. 5) opposite the lens. Now, it is known that the thin plates of silicon in the dimensions used (of the order of 100 mm) have cambers of which the depth may be as much as 10 microns.

The problem arises (FIG. 6) of bringing the zone of the thin plate of which an impression is to be made into the image plane of the lens.

It can be shown that the sum of the four pressures $P_1$, $P_2$, $P_3$, $P_4$ delivered by the four differential pneumatic sensors is proportional to the distance $\Delta Z$ between the image plane and the plane of the thin plate in the region of the zone of which an impression is to be made.

This may be expressed by the relation $\Delta Z = Z - Z_0$ ' $K_1(P_1 + P_2 + P_3 + P_4)$.

Similarly, it can be shown that, if $\alpha_x$ and $\alpha_y$ are the angles of the plane of the zone to be recorded with the two rectangular axes, parallel to the image plane, passing through the centres of the orifices 101 and 103, 102 and 104, $\alpha_x = K_2(P_2 - P_4)$ and $\alpha_y = K_3(P_1 - P_3)$.

An electronic circuit 200 receives the four output voltages $V_1$, $V_2$, $V_3$ and $V_4$ of the pneumatic sensors and produces from them three error voltages $U_1$, $U_2$, $U_3$ which are applied (FIG. 7) through three amplifiers 201, 202 and 203 to the three piezoelectric bars 7.

The synoptic diagram of the associated electronic system is shown in FIG. 8.

The electronic system comprises a computer 1000 of which one output controls the movements of the table 1002 by way of motors 1001, whilst its other output triggers the light source 1003. The assembly comprising the light source 1003, the mask 1004, the lens 1005 and the sensors 1006 is integral. A correcting device 1007, shown in FIG. 7, corrects the movements of the sample holder by acting on the bars, as described earlier on.

Certain modifications may of course be made to the apparatus without departing from the scope of the invention.

It is emphasised that, in the assembly described above, it is possible to use a table which moves at high speed, for example 25 millimeters per second.

The time constant of the specimen holder must be compatible with this rate of travel, i.e. less than one tenth of a second.

What I claim is:

1. A mask photorepeater apparatus comprising a light source for radiating a light beam, and upon said light beam trajectory, a mask, an optical system, a table having means for carrying a sample holder, said system being adapted for forming of said mask, upon said sample, an image with a magnification factor substantially lower than 1, motor means for displacing said table, and computer means, for controlling said motor means according a predetermined program, said carrying means comprising at least three piezoelectric bars having respective electric control inputs, pneumatic sensors tied to said optical system, for sensing the distance between said sample and the front of said optical means, and for delivering control signals to said inputs of said bars.

2. An apparatus as claimed in claim 1, wherein said pneumatic sensors are of the differential type and comprise nozzles arranged in the vicinity of the front of said system, said nozzles being positioned at the top of a square contained in a plane perpendicular to the optical axis and centred thereon.

3. An apparatus as claimed in claim 1, wherein the neutral axis of the sample is made flat, means being provided for applying said sample to said sample holder.

4. An apparatus as claimed in claim 3, wherein said applying means comprise a pump, and pipes connected to said pump for creating a reduced pressure.

5. An apparatus as claimed in claim 1, wherein said sample specimen is a thin plate of the order of 10 centimeters of transverse dimensions made of a semiconductor material, and wherein said optical system has a magnification of the order of 1/10.

* * * * *